United States Patent
Nitta et al.

(10) Patent No.: US 10,720,325 B2
(45) Date of Patent: Jul. 21, 2020

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventors: Takafumi Nitta, Toyama (JP); Yushin Takasawa, Toyama (JP); Satoshi Shimamoto, Toyama (JP); Hiroki Yamashita, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 15/877,087

(22) Filed: Jan. 22, 2018

(65) Prior Publication Data

US 2018/0218897 A1 Aug. 2, 2018

(30) Foreign Application Priority Data

Jan. 27, 2017 (JP) .................................. 2017-012823

(51) Int. Cl.
*H01L 21/02* (2006.01)
*C23C 16/52* (2006.01)
(Continued)

(52) U.S. Cl.
CPC ........ *H01L 21/0228* (2013.01); *C23C 16/401* (2013.01); *C23C 16/45527* (2013.01);
(Continued)

(58) Field of Classification Search
CPC ....... H01L 21/02104–02107; H01L 21/02123; H01L 21/02126; H01L 21/02129; H01L 21/02137; H01L 21/02142; H01L 21/022; H01L 21/02205–02216; H01L 21/02225–02233; H01L 21/31625; H01L 21/02–0201; H01L 21/02263–0228; H01L 21/02318–02323; H01L 21/02337–02362
See application file for complete search history.

(56) References Cited

U.S. PATENT DOCUMENTS 9,312,123 B2 * 4/2016 Takasawa ......... C23C 16/45531
9,384,968 B2 * 7/2016 Takasawa ......... C23C 16/45531
(Continued)

FOREIGN PATENT DOCUMENTS

JP    2011-023576 A    2/2011
JP    2014-154809 A    8/2014

*Primary Examiner* — Maliheh Malek
(74) *Attorney, Agent, or Firm* — Edell, Shapiro & Finnan, LLC (57) ABSTRACT

Provided is a technique which includes forming on a substrate an oxide film containing silicon or a metal element and doped with a dopant by performing a cycle a predetermined number of times, wherein the cycle includes sequentially and non-simultaneously performing: (a) supplying a first gas to the substrate wherein the first gas is free of chlorine and contains boron or phosphorus as the dopant; (b) supplying a second gas to the substrate wherein the second gas contains silicon or the metal element; and (c) supplying a third gas to the substrate wherein the third gas contains oxygen.

15 Claims, 6 Drawing Sheets

(51) Int. Cl.
*C23C 16/40* (2006.01)
*C23C 16/455* (2006.01)

(52) U.S. Cl.
CPC ........ *C23C 16/45531* (2013.01); *C23C 16/52* (2013.01); *H01L 21/02129* (2013.01); *H01L 21/02211* (2013.01); *H01L 21/02219* (2013.01); *H01L 21/02277* (2013.01)

(56) References Cited

U.S. PATENT DOCUMENTS

| | | | | |
|---|---|---|---|---|
| 9,384,971 B2* | 7/2016 | Takasawa | ......... | C23C 16/45531 |
| 9,384,972 B2* | 7/2016 | Takasawa | ......... | C23C 16/45531 |
| 9,385,013 B2* | 7/2016 | Takasawa | ......... | C23C 16/45531 |
| 9,443,719 B2* | 9/2016 | Takasawa | ......... | C23C 16/45531 |
| 9,443,720 B2* | 9/2016 | Takasawa | ......... | C23C 16/45531 |
| 9,478,417 B2* | 10/2016 | Takasawa | ......... | C23C 16/45531 |
| 9,487,861 B2* | 11/2016 | Takasawa | ......... | C23C 16/45531 |
| 9,929,005 B1* | 3/2018 | Shimamoto | ........... | C23C 16/401 |
| 10,026,607 B2* | 7/2018 | Takasawa | ......... | C23C 16/45531 |
| 10,340,134 B2* | 7/2019 | Hirose | | |
| 2001/0024387 A1* | 9/2001 | Raaijmakers | ..... | H01L 21/02159 365/200 |
| 2001/0041250 A1* | 11/2001 | Werkhoven | ........... | C23C 16/029 428/212 |
| 2002/0000644 A1* | 1/2002 | Jeon | ...................... | C23C 16/401 257/650 |
| 2002/0130385 A1* | 9/2002 | Jung | ...................... | C23C 16/401 257/524 |
| 2003/0072975 A1* | 4/2003 | Shero | ................... | C23C 16/308 428/704 |
| 2005/0142716 A1* | 6/2005 | Nakajima | ......... | H01L 21/28194 438/197 |
| 2005/0181555 A1* | 8/2005 | Haukka | ................. | C23C 16/029 438/232 |
| 2008/0268644 A1* | 10/2008 | Kameda | .............. | H01L 21/3185 438/694 |
| 2009/0117714 A1* | 5/2009 | Akae | ................. | H01L 21/02532 438/479 |
| 2010/0105192 A1* | 4/2010 | Akae | ................. | C23C 16/45525 438/478 |
| 2010/0130024 A1* | 5/2010 | Takasawa | ......... | C23C 16/45531 438/761 |
| 2011/0076857 A1* | 3/2011 | Akae | ...................... | C23C 16/32 438/769 |
| 2011/0124204 A1* | 5/2011 | Ota | ...................... | C23C 16/402 438/787 |
| 2011/0193595 A1* | 8/2011 | Fukuda | .................. | H03K 5/151 327/108 |
| 2011/0230057 A1* | 9/2011 | Takasawa | ............... | C23C 16/36 438/763 |
| 2011/0256733 A1* | 10/2011 | Hirose | ................... | C23C 16/30 438/770 |
| 2011/0294280 A1* | 12/2011 | Takasawa | ............... | C23C 16/30 438/478 |
| 2011/0318940 A1* | 12/2011 | Ota | ...................... | C23C 16/34 438/776 |
| 2012/0028454 A1* | 2/2012 | Swaminathan | ....... | C23C 16/045 438/558 |
| 2012/0184110 A1* | 7/2012 | Hirose | ................... | C23C 16/30 438/763 |
| 2012/0249217 A1* | 10/2012 | Fukuda | ............... | H01L 27/0207 327/436 |
| 2012/0319252 A1* | 12/2012 | Yamazaki | ........... | C23C 16/40 257/646 |
| 2013/0052836 A1* | 2/2013 | Hirose | ................... | C23C 16/30 438/762 |
| 2013/0149873 A1* | 6/2013 | Hirose | ................... | H01L 21/31 438/763 |
| 2013/0237064 A1* | 9/2013 | Kirikihira | ......... | H01L 21/67109 438/758 |
| 2013/0252435 A1* | 9/2013 | Shimamoto | ....... | H01L 21/02263 438/758 |
| 2013/0273748 A1* | 10/2013 | Sasajima | ............. | H01L 21/0214 438/786 |
| 2013/0337660 A1* | 12/2013 | Ota | ....................... | C23C 16/308 438/786 |
| 2014/0057452 A1* | 2/2014 | Hashimoto | ............. | C23C 16/30 438/761 |
| 2014/0073142 A1* | 3/2014 | Hirose | ................... | C23C 16/30 438/762 |
| 2014/0227886 A1 | 8/2014 | Sano et al. | | |
| 2014/0235067 A1* | 8/2014 | Shimamoto | ............. | C23C 16/36 438/763 |
| 2014/0273507 A1* | 9/2014 | Hirose | ................... | C23C 16/36 438/758 |
| 2014/0287595 A1* | 9/2014 | Shimamoto | ....... | H01L 21/02126 438/774 |
| 2014/0287597 A1* | 9/2014 | Hirose | ................... | C23C 16/30 438/786 |
| 2014/0349492 A1* | 11/2014 | Shimamoto | ........... | C23C 16/401 438/786 |
| 2015/0044881 A1* | 2/2015 | Shimamoto | ....... | H01J 37/32449 438/783 |
| 2015/0072537 A1* | 3/2015 | Noda | ................ | H01L 21/02126 438/786 |
| 2015/0147891 A1* | 5/2015 | Sano | ..................... | H01L 21/022 438/769 |
| 2015/0171179 A1* | 6/2015 | Horii | ................... | H01L 29/4966 257/761 |
| 2015/0187559 A1* | 7/2015 | Sano | ..................... | H01L 21/022 438/763 |
| 2015/0200085 A1* | 7/2015 | Sano | ................ | C23C 16/36 438/763 |
| 2015/0206736 A1* | 7/2015 | Akae | ................... | H01L 21/0228 438/786 |
| 2015/0214024 A1* | 7/2015 | Takasawa | ......... | C23C 16/45531 438/763 |
| 2015/0228474 A1* | 8/2015 | Hanashima | ......... | H01L 21/0228 438/778 |
| 2015/0243499 A1* | 8/2015 | Yamamoto | ............... | C23C 16/52 438/763 |
| 2015/0255269 A1* | 9/2015 | Harada | ............. | H01L 21/67017 438/763 |
| 2015/0255274 A1* | 9/2015 | Yamamoto | ........ | H01L 21/02167 438/765 |
| 2015/0287588 A1* | 10/2015 | Sano | ................ | C23C 16/36 438/763 |
| 2015/0357181 A1* | 12/2015 | Yamamoto | .......... | H01L 21/0228 438/778 |
| 2016/0013042 A1* | 1/2016 | Hashimoto | ............. | C23C 16/30 438/778 |
| 2016/0024659 A1* | 1/2016 | Shimamoto | ....... | H01L 21/02167 438/778 |
| 2016/0064219 A1* | 3/2016 | Yamamoto | ........ | H01L 21/02334 438/778 |
| 2016/0071720 A1* | 3/2016 | Nitta | ................... | H01L 21/0228 438/763 |
| 2016/0086791 A1* | 3/2016 | Sano | ..................... | H01L 21/022 |
| 2016/0141173 A1* | 5/2016 | Moriya | ............. | H01L 21/02598 438/479 |
| 2016/0148824 A1* | 5/2016 | Takasawa | ......... | C23C 16/45531 118/715 |
| 2016/0211132 A1* | 7/2016 | Takasawa | ......... | C23C 16/45531 |
| 2016/0211133 A1* | 7/2016 | Takasawa | ......... | C23C 16/45531 |
| 2016/0211134 A1* | 7/2016 | Takasawa | ......... | C23C 16/45531 |
| 2016/0211135 A1* | 7/2016 | Noda | ................ | H01L 21/02126 |
| 2016/0225607 A1* | 8/2016 | Yamamoto | ........... | H01L 21/0228 |
| 2016/0298236 A1* | 10/2016 | Takasawa | ......... | C23C 16/45531 |
| 2016/0329208 A1* | 11/2016 | Takasawa | ......... | C23C 16/45531 |
| 2016/0358767 A1* | 12/2016 | Nitta | ................... | H01L 21/0228 |
| 2017/0092486 A1* | 3/2017 | Nitta | ..................... | C23C 16/24 |
| 2017/0170004 A1* | 6/2017 | Harada | ............. | C23C 16/45527 |
| 2017/0178889 A1* | 6/2017 | Yamakoshi | ............. | C23C 16/34 |
| 2017/0186604 A1* | 6/2017 | Orihashi | ............. | H01L 21/0245 |
| 2017/0200599 A1* | 7/2017 | Takasawa | ......... | C23C 16/45531 |
| 2017/0221699 A1* | 8/2017 | Orihashi | ............. | H01L 21/02576 |
| 2017/0263439 A1* | 9/2017 | Hashimoto | ......... | C23C 16/45527 |
| 2017/0263441 A1* | 9/2017 | Orihashi | ............. | C23C 16/45544 |
| 2017/0294302 A1* | 10/2017 | Hirose | ............. | H01L 21/02112 |

(56) References Cited

U.S. PATENT DOCUMENTS

| | | | | |
|---|---|---|---|---|
| 2017/0294305 A1* | 10/2017 | Orihashi | ............... | C23C 16/455 |
| 2017/0298508 A1* | 10/2017 | Yamakoshi | ....... | H01L 21/67017 |
| 2017/0345645 A1* | 11/2017 | Harada | ............. | H01L 21/02255 |
| 2017/0365467 A1* | 12/2017 | Shimamoto | ......... | C23C 16/0272 |
| 2018/0033622 A1* | 2/2018 | Swaminathan | ..... | H01L 21/0337 |
| 2018/0061628 A1* | 3/2018 | Ou | ...................... | H01L 21/0228 |
| 2018/0240665 A1* | 8/2018 | Sano | ................ | H01L 21/02126 |
| 2018/0301347 A1* | 10/2018 | Kihara | ............. | H01L 21/31116 |
| 2018/0337031 A1* | 11/2018 | Hashimoto | ........... | H01L 21/022 |
| 2019/0218666 A1* | 7/2019 | Harada | ................ | C23C 16/455 |
| 2019/0221425 A1* | 7/2019 | Hashimoto | ............. | C23C 16/36 |

* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This application claims foreign priority under 35 U.S.C. § 119(a)-(d) to Application No. Japanese Patent Application No. 2017-012823, filed on Jan. 27, 2017 the entire contents of which are hereby incorporated by reference.

TECHNICAL FIELD

The present disclosure relates to a method of manufacturing a semiconductor device, a substrate processing apparatus and a non-transitory computer-readable recording medium.

BACKGROUND

A process of forming an oxide film doped with a dopant such as boron (B) and phosphorus (P) may be performed on a substrate as one of semiconductor device manufacturing processes.

SUMMARY

Described herein is a technique capable of increasing a dopant concentration of the oxide film formed on a substrate.

According to one aspect of the present disclosure, there is provided a technique which includes forming on a substrate an oxide film containing silicon or a metal element and doped with a dopant by performing a cycle a predetermined number of times, wherein the cycle includes sequentially and non-simultaneously performing: (a) supplying a first gas to the substrate wherein the first gas is free of chlorine and contains boron or phosphorus as the dopant; (b) supplying a second gas to the substrate wherein the second gas contains silicon or the metal element; and (c) supplying a third gas to the substrate wherein the third gas contains oxygen.

DETAILED DESCRIPTION

Embodiment

Hereinafter, an embodiment will be described with reference to FIGS. 1 through 3.

(1) Configuration of Substrate Processing Apparatus

Figure 1:
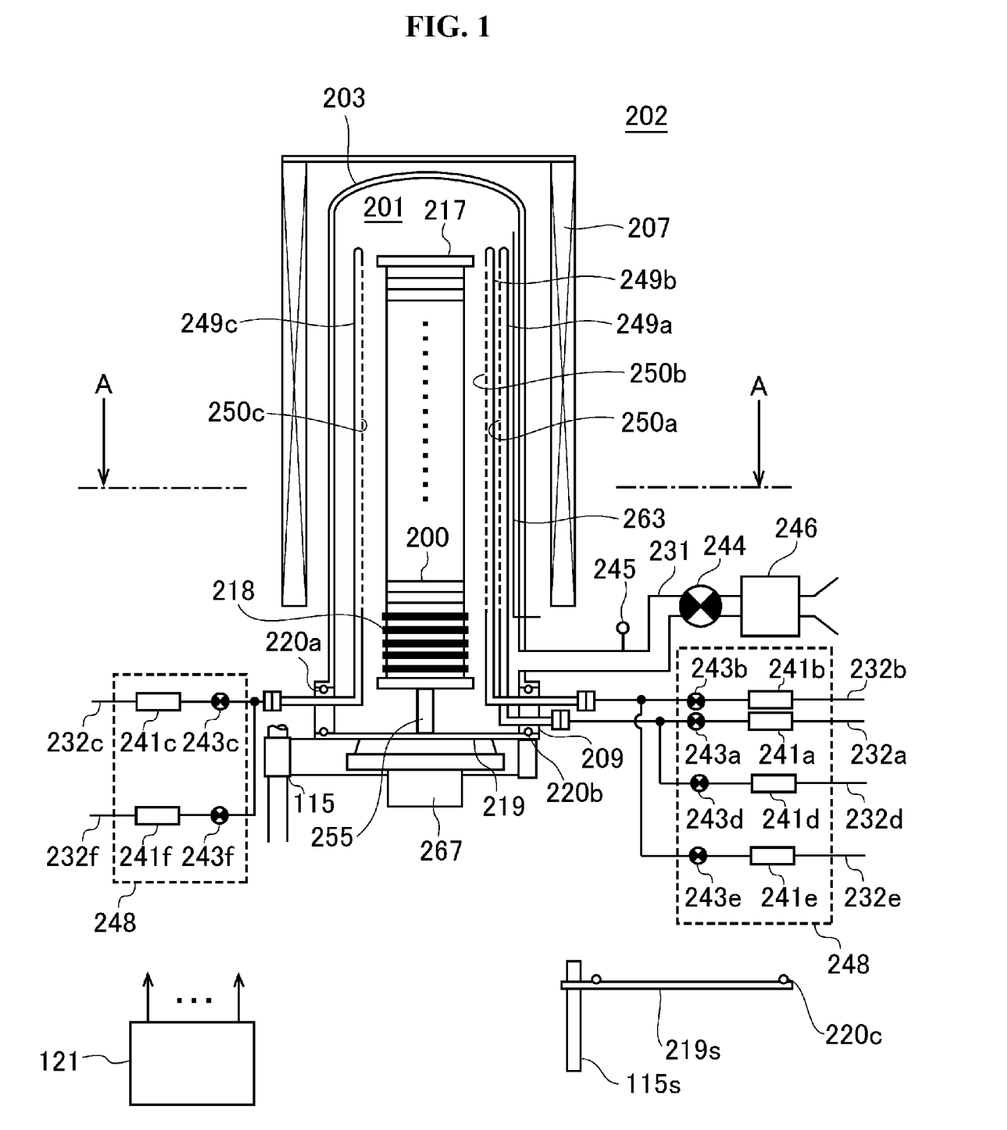
FIG. 1 schematically illustrates a vertical cross-section of a vertical type processing furnace of a substrate processing apparatus preferably used in an embodiment described herein.

As illustrated in FIG. 1, a processing furnace 202 includes a heater 207 serving as a heating mechanism (temperature adjusting unit). The heater 207 is cylindrical, and vertically installed while being supported by a support plate (not shown). The heater 207 also functions as an activation mechanism (excitation unit) for activating (exciting) a gas by heat.

A reaction tube 203 is provided in and concentric with the heater 207. The reaction tube 203 is made of a heat-resistant material such as quartz ($SiO_2$) and silicon carbide (SiC), and cylindrical with a closed upper end and an open lower end. A manifold 209 is provided under and concentric with the reaction tube 203. The manifold 209 is made of a metal such as stainless steel (SUS), and cylindrical with open upper and lower ends. The upper end of the manifold 209 is engaged with the lower end of the reaction tube 203 so as to support the reaction tube 203. An O-ring 220a serving as a sealing member is provided between the manifold 209 and the reaction tube 203. The reaction tube 203 is vertically installed with the manifold 209 supported by the support plate (not shown). A processing vessel (reaction vessel) is constituted by the reaction tube 203 and the manifold 209. A process chamber 201 is provided in the hollow cylindrical portion of the processing vessel. The process chamber 201 is capable of accommodating wafers (substrates) 200.

Nozzles 249a, 249b and 249c are provided in the process chamber 201 through sidewalls of the manifold 209. Gas supply pipes 232a, 232b and 232c are connected to the nozzles 249a, 249b and 249c, respectively.

MFCs (Mass Flow Controllers) 241a, 241b and 241c serving as flow rate controllers (flow rate control units) and valves 243a, 243b and 243c serving as opening/closing valves are sequentially installed at the gas supply pipes 232a, 232b and 232c from the upstream sides toward the downstream sides of the gas supply pipes 232a, 232b and 232c, respectively. Gas supply pipes 232d, 232e and 232f for supplying an inert gas are connected to the downstream sides of the valves 243a, 243b and 243c installed at the gas supply pipes 232a, 232b and 232c, respectively. MFCs 241d, 241e and 241f and valves 243d, 243e and 243f are sequentially installed at the gas supply pipes 232d, 232e and 232f from the upstream sides toward the downstream sides of the gas supply pipes 232d, 232e and 232f, respectively.

Figure 2:
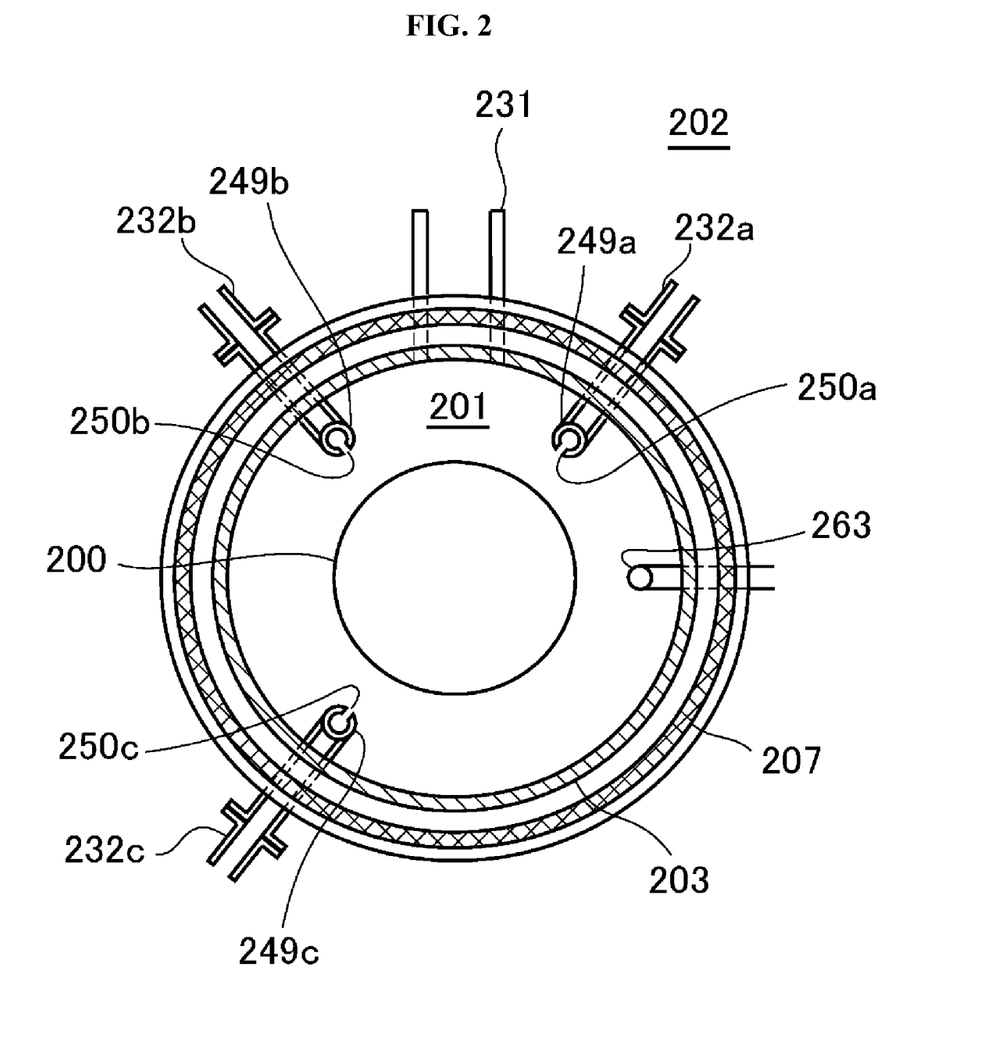
FIG. 2 schematically illustrates a cross-section taken along the line A-A of the vertical type processing furnace of the substrate processing apparatus shown in FIG. 1.

As shown in FIG. 2, the nozzles 249a, 249b and 249c are provided in an annular space between the inner wall of the reaction tube 203 and the wafers 200, and extend from bottom to top of the inner wall of the reaction tube 203 along the stacking direction of the wafers 200, respectively. That is, the nozzles 249a, 249b and 249c are provided in a region that horizontally surrounds a wafer arrangement region at one side of the wafer arrangement region where the wafers 200 are arranged. A plurality of gas supply holes 250a, a plurality of gas supply holes 250b and a plurality of gas supply holes 250c for supplying gases are provided at side surfaces of the nozzles 249a, 249b and 249c, respectively.

The plurality of gas supply holes 250a, the plurality of gas supply holes 250b and the plurality of gas supply holes 250c are open toward the center of the reaction tube 203, and configured to supply gases toward the wafers 200. The plurality of gas supply holes 250a, the plurality of gas supply holes 250b and the plurality of gas supply holes 250c are provided from the lower portion of the reaction tube 203 to the upper portion thereof.

A first gas (source gas) containing boron or phosphorus as a dopant and free of chlorine (Cl), e.g, a boron-containing gas or a phosphorus-containing gas, is supplied into the process chamber 201 via the MFC 241a and the valve 243a, which are provided at the gas supply pipe 232a, and the nozzle 249a. The source gas may include a gaseous source, for example, a gas obtained by evaporating a source in liquid state under normal temperature and pressure as well as a source in gaseous state under normal temperature and pressure. The boron-containing gas, for example, includes triethylborane (($CH_3CH_2)_3B$, abbreviated as TEB) gas which is an alkylborane. The phosphorus-containing gas, for example, includes phosphine ($PH_3$, abbreviated as PH) gas which is a phosphorus hydride. The boron-containing gas and the phosphorus-containing gas are also referred to as dopant gases.

A second (source gas) gas (silicon-containing gas) containing silicon (Si) as a predetermined element (main element) is supplied into the process chamber 201 via the MFC 241b and the valve 243b, which are provided at the gas supply pipe 232b, and the nozzle 249b. For example, the silicon-containing gas may include bis(tertiary-butylamino) silane ($SiH_2[NH(C_4H_9)]_2$, abbreviated as BTBAS) gas, which is aminosilane containing an amino group (amino ligand).

A third gas containing oxygen (O) (oxygen-containing gas), which is a reactant (reactive gas), is supplied into the process chamber 201 via the MFC 241c, the valve 243c and the nozzle 249c. The oxygen-containing gas, for example, includes ozone ($O_3$) gas.

The inert gas, such as nitrogen (N2) gas, is supplied into the process chamber 201 via the gas supply pipes 232d, 232e and 232f provided with the MFCs 241d, 241e and 241f and the valves 243d, 243e and 243f, the gas supply pipes 232a, 232b and 232c and the nozzles 249a, 249b and 249c, respectively. The N2 gas acts as a purge gas or a carrier gas.

The gas supply pipe 232a, the MFC 241a and the valve 243a constitute a first supply system. The gas supply pipe 232b, the MFC 241b the valve 243b constitute a second supply system. The gas supply pipe 232c, the MFC 241c and the valve 243c constitute a third supply system. The gas supply pipes 232d, 232e and 232f, the MFCs 241d, 241e and 241f and the valves 243d, 243e and 243f constitute an inert gas supply system.

Any one or all of the above-described supply systems may be embodied as an integrated gas supply system 248 in which the components such as the valves 243a through 243f or the MFCs 241a through 241f are integrated. The integrated gas supply system 248 is connected to the respective gas supply pipes 232a through 232f. An operation of the integrated gas supply system 248 to supply various gases to the gas supply pipes 232a through 232f, for example, operations such as an operation of opening/closing the valves 243a through 243f and an operation of adjusting a flow rate through the MFCs 241a through 241f may be controlled by a controller 121 described later. The integrated gas supply system 248 may be embodied as an integrated unit having an all-in-one or divided structure. The components of the integrated gas supply system 248, such as the gas supply pipes 232a through 232f, can be attached/detached on a basis of the integrated unit. Operations such as maintenance, exchange and addition of the integrated gas supply system 248 may be performed on a basis of the integrated unit.

An exhaust pipe 231 for exhausting the inner atmosphere of the process chamber 201 is provided at the lower sidewall of the reaction tube 203. A vacuum pump 246 serving as a vacuum exhauster is connected to the exhaust pipe 231 through a pressure sensor 245 and an APC (Automatic Pressure Controller) valve 244. The pressure sensor 245 serves as a pressure detector (pressure detection unit) to detect the inner pressure of the process chamber 201, and the APC valve 244 serves as a pressure controller (pressure adjusting unit). With the vacuum pump 246 in operation, the APC valve 244 may be opened/closed to vacuum-exhaust the process chamber 201 or stop the vacuum exhaust. With the vacuum pump 246 in operation, the opening degree of the APC valve 244 may be adjusted based on the pressure detected by the pressure sensor 245, in order to control the inner pressure of the process chamber 201. An exhaust system includes the exhaust pipe 231, the APC valve 244 and the pressure sensor 245. The exhaust system may further include the vacuum pump 246.

A seal cap 219, serving as a furnace opening cover capable of airtightly sealing the lower end opening of the manifold 209, is provided under the manifold 209. The seal cap 219 is made of metal such as SUS, and is a disk-shaped. An O-ring 220b serving as a sealing member is provided on the upper surface of the seal cap 219 so as to be in contact with the lower end of the manifold 20. A rotating mechanism 267 to rotate a boat 217 described later is provided under the seal cap 219. A rotating shaft 255 of the rotating mechanism 267 is connected to the boat 217 through the seal cap 219. As the rotating mechanism 267 rotates the boat 217, the wafers 200 are rotated. The seal cap 219 may be moved upward/downward in the vertical direction by a boat elevator 115 provided outside the reaction tube 203 vertically and serving as an elevating mechanism. When the seal cap 219 is moved upward/downward by the boat elevator 115, the boat 217 may be loaded into the process chamber 201 or unloaded out of the process chamber 201. The boat elevator 115 serves as a transfer device (transfer mechanism) that loads the boat 217, that is, the wafers 200 into the process chamber 201 or unloads the boat 217, that is, the wafers 200 out of the process chamber 201. A shutter 219s is provided under the manifold 209. While the seal cap 219 is lowered by the boat elevator 115, the shutter 219s can airtightly close the lower end opening of the manifold 209. The shutter 219s is made of metal such as SUS, and is a disk-shaped. An O-ring 220c serving as a sealing member to be in contact with the lower end of the manifold 209 is provided on the upper surface of the shutter 219s. A shutter opening/closing mechanism 115s controls an operation of opening/closing the shutter 219s, for example, an elevating operation or rotating operation.

The boat (substrate retainer) 217 supports concentrically arranged wafers 200 (e.g. 25 to 200 wafers) in vertical direction while each of the wafers 200 are in horizontal orientation. That is, the boat 217 supports, in multiple stages, concentrically arranged the wafers 200 with a predetermined interval therebetween. The boat 217 is made of a heat-resistant material such as quartz and SiC. An insulating plate 218 is made of a heat-resistant material such as quartz and SiC, and provided under the boat 217 in multiple stages.

A temperature sensor (temperature detector) 263 is provided in the reaction tube 203. The energization state of the heater 207 is controlled based on the temperature detected by the temperature sensor 263 such that the inner temperature of the process chamber 201 has a desired temperature distribution. The temperature sensor 263 is provided along the inner wall of the reaction tube 203.

Figure 3:
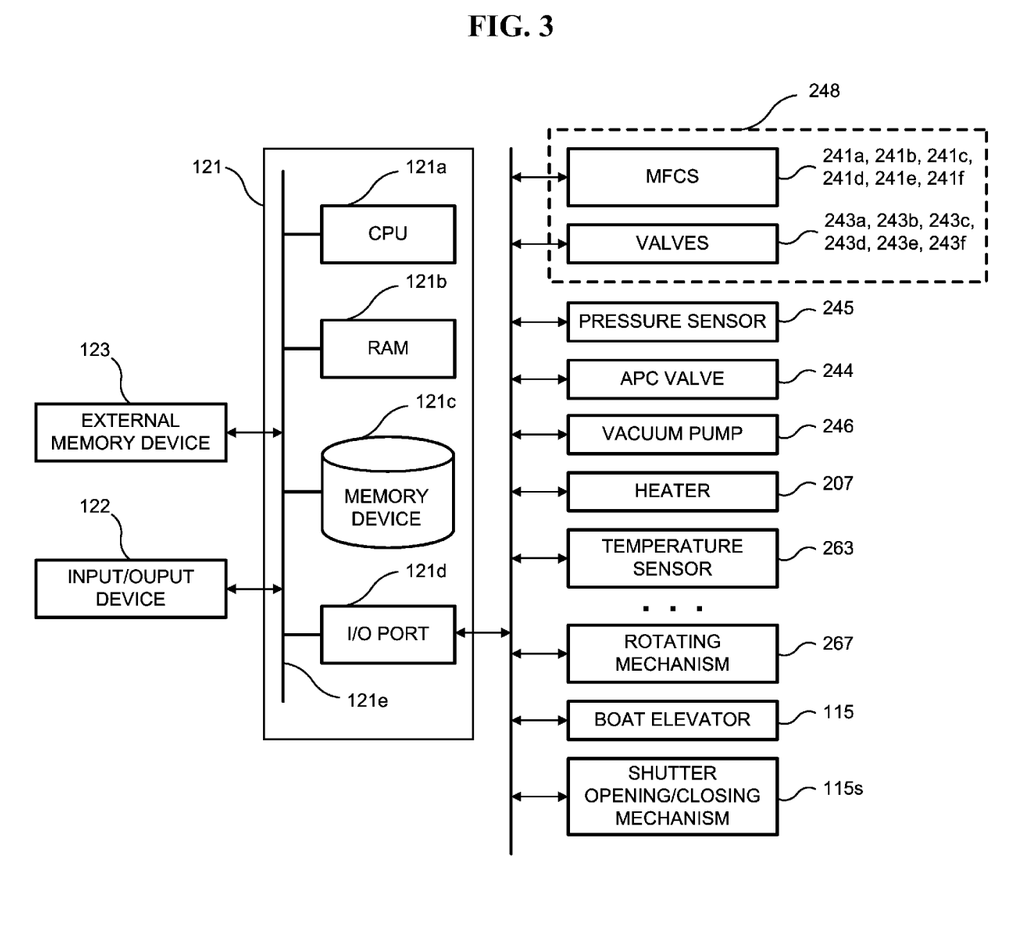
FIG. 3 is a block diagram schematically illustrating a configuration of a controller and components controlled by the controller of the substrate processing apparatus preferably used in the embodiment.

As shown in FIG. 3, the controller 121 serving as a control unit (control means) is embodied by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an I/O device 122 such as a touch panel is connected to the controller 121.

The memory device 121c is embodied by components such as a flash memory and HDD (Hard Disk Drive). A control program for controlling the operation of the substrate processing apparatus or a process recipe containing information on the sequence and conditions of a substrate processing described later is readably stored in the memory device 121c. The process recipe is obtained by combining steps of the substrate processing described later such that the controller 121 may execute the steps to acquire a predetermine result, and functions as a program. Hereafter, the process recipe and the control program are collectively referred to as a program. The process recipe is simply referred to as a recipe. In this specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 241a through 241f, the valves 243a through 243f, the pressure sensor 245, the APC valve 244, the vacuum pump 246, the temperature sensor 263, the heater 207, the rotating mechanism 267, the boat elevator 115 and the shutter opening/closing mechanism 115s.

The CPU 121a is configured to read a control program from the memory device 121c and execute the read control program. Furthermore, the CPU 121a is configured to read a recipe from the memory device 121c according to an operation command inputted from the I/O device 122. According to the contents of the read recipe, the CPU 121a may be configured to control various operations such as flow rate adjusting operations for various gases by the MFCs 241a through 241f, opening/closing operations of the valves 243a through 243f, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, a rotation operation and rotation speed adjusting operation of the boat 217 by the rotating mechanism 267, an elevating operation of the boat 217 by the boat elevator 115, and an opening/closing operation of the shutter 219s by the shutter opening/closing mechanism 115s.

The controller 121 may be embodied by installing the above-described program stored in an external memory device 123 into a computer, the external memory device 123 including a magnetic disk such as a hard disk, an optical disk such as CD, a magneto-optical disk such as MO, and a semiconductor memory such as a USB memory. The memory device 121c or the external memory device 123 may be embodied by a non-transitory computer readable recording medium. Hereafter, the memory device 121c and the external memory device 123 are collectively referred to as recording media. In this specification, "recording media" may indicate only the memory device 121c, indicate only the external memory device 123, and indicate both of the memory device 121c and the external memory device 123. In addition to the external memory device 123, a communication unit such as the Internet and dedicated line may be used as the unit for providing a program to a computer.

(2) Film-Forming Process

Next, an exemplary film-forming sequence of forming a film on a wafer 200, which is a substrate processing for manufacturing a semiconductor device, using the above-described substrate processing apparatus will be described with reference to FIG. 4a. Herein, the components of the substrate processing apparatus are controlled by the controller 121.

Figure 4A:
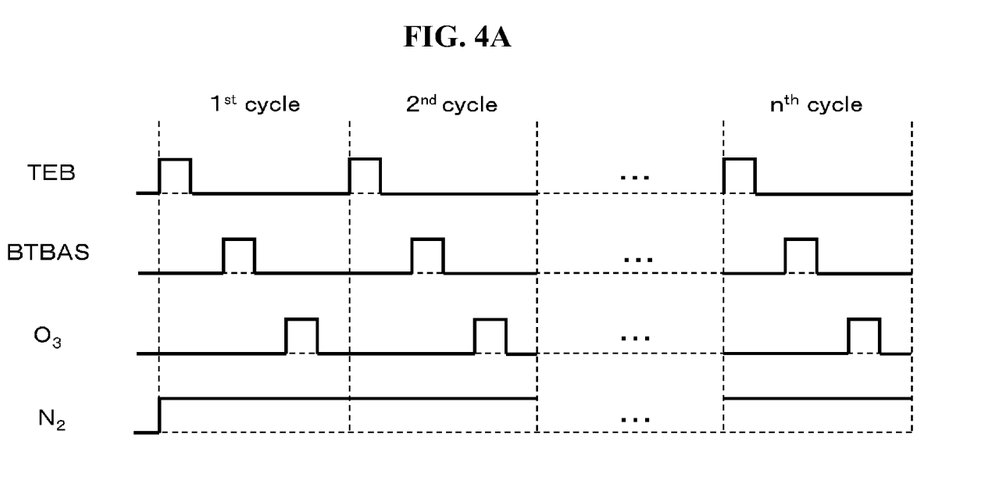
FIG. 4A schematically illustrates a film-forming sequence according to the embodiment, and FIG. 4B schematically illustrates a first modified example of the film-forming sequence according to the embodiment.

FIG. 4a schematically illustrates a film-forming sequence according to the embodiment. As shown in FIG. 4a, a boron-doped film containing silicon and oxygen, i.e., a boron-doped silicon oxide (SiO) film is formed on the wafer 200 by performing a cycle a predetermined number of times. The cycle includes sequentially and non-simultaneously performing: a first step of supplying TEB gas to the wafer 200; a second step of supplying BTBAS gas to the wafer 200; and a third step of supplying $O_3$ gas to the wafer 200.

Herein, the film-forming sequence shown in FIG. 4a according to the embodiment may be represented as follows. The same applies to the modified examples which will be described later. Herein, the boron-doped SiO film (layer) may be referred to as a SiBO film (layer), or simply as a SiO film (layer).

(TEB→BTBAS→$O_3$)×n→boron-doped SiO

Herein, "wafer" may refer to "a wafer itself" or to "a wafer and a stacked structure (aggregated structure) of predetermined layers or films formed on the surface of the wafer". That is, the wafer and the predetermined layers or films formed on the surface of the wafer may be collectively referred to as the wafer. In this specification, "surface of wafer" refers to "a surface (exposed surface) of a wafer" or to "the surface of a predetermined layer or film formed on the wafer, i.e. the top surface of the wafer as a stacked structure". Thus, in this specification, "forming a predetermined layer (or film) on a wafer" may refer to "forming a predetermined layer (or film) on a surface of wafer itself" or to "forming a predetermined layer (or film) on a surface of a layer or film formed on the wafer", i.e. "forming a predetermined layer (or film) on a top surface of a stacked structure". Herein, "substrate" and "wafer" may be used as substantially the same meaning.

Wafer Charging and Boat Loading Step

Wafers 200 are charged into the boat 217 (wafer charging). The shutter opening/closing mechanism 115s moves the shutter 219s to open the lower end opening of the manifold 209 (shutter opening). Thereafter, as shown in FIG. 1, the boat 217 charged with the wafers 200 is lifted by the boat elevator 115 and loaded into the process chamber 201 (boat loading). With the boat 217 loaded, the seal cap 219 seals the lower end of the manifold 209 through the O-ring 220b.

Pressure and Temperature Adjusting Step

The vacuum pump 246 vacuum-exhausts the process chamber 201 such that the inner pressure of the process chamber 201, i.e., the pressure of the space in which the wafers 200 are present is set to a desired pressure (vacuum level). At this time, the inner pressure of the process chamber 201 is measured by the pressure sensor 245, and the APC valve 244 is feedback controlled based on the measured pressure. The heater 207 heats the process chamber 201 such that the temperature of the wafers 200 in the process chamber 201 becomes a desired temperature. The energization state of the heater 207 is feedback controlled based on the temperature detected by the temperature sensor 263 such that the inner temperature of the process chamber 201 has a desired temperature distribution. The rotating mechanism 267 starts to rotate the boat 217 and the wafers 200. The vacuum pump 246 continuously vacuum-exhausts the process chamber 201, the heater 207 continuously heats the process chamber 201, and the rotating mechanism 267 continuously rotates the boat 217 and the wafer 200 until at least the process for the wafers 200 is complete.

Film-Forming Process

Next, the film forming process is performed by performing the first step, the second step and the third step sequentially.

First Step

In the first step, TEB gas is supplied to the wafer 200 in the process chamber 201.

Specifically, the valve 243a is opened to supply the TEB gas into the gas supply pipe 232a. After the flow rate of TEB gas is adjusted by the MFC 241a, the TEB gas is supplied into the process chamber 201 and onto the wafer 200 through the nozzle 249a and exhausted through the exhaust pipe 231. Simultaneously, the valves 243d through 243f are opened to supply $N_2$ gas into the gas supply pipes 232d through 232f. After the flow rate of $N_2$ gas is adjusted by the MFCs 241d through 241f, the $N_2$ gas is supplied along with the TEB gas into the process chamber 201 through the nozzles 249a through 249c, and exhausted through the exhaust pipe 231.

Exemplary processing conditions of the first step are as follows:

The flow rate of TEB gas: 10 sccm to 1,000 sccm;

The time duration of TEB gas supply: 1 second to 120 seconds, preferably 1 second to 60 seconds;

The flow rate of $N_2$ gas: 50 sccm to 10,000 sccm;

The film-forming temperature: 200° C. to 400° C., preferably 300° C. to 350° C.; and The film-forming pressure: 0.5 Torr to 5 Torr (66.5 Pa to 665 Pa).

When the film-forming temperature is less than 200° C. or the film-forming pressure is less than 66.5 Pa, it is difficult to form the boron-containing layer described later on the wafer 200 such that the boron-doped SiO film may not be formed on the wafer 200. Moreover, the film-forming rate of the $SiO_2$ film formed on the wafer 200 may be lowered. When the film-forming temperature equal to or higher than 200° C. or the film-forming pressure equal to or higher than 66.5 Pa facilitates the formation of the boron-containing layer on the wafer 200 such that the formation of the boron-doped SiO2 on the wafer 200 is facilitated. Moreover, a practical film-forming rate of the $SiO_2$ film formed on the wafer 200 may be obtained. When the film-forming temperature equal to or higher than 300° C. further facilitates the formation of the boron-containing layer on the wafer 200 and an increase in the film-forming rate.

When the film-forming temperature exceeds 400° C. or the film-forming pressure exceeds 665 Pa, TEB is excessively decomposed, resulting in an excessive gaseous reaction in the process chamber 201. Therefore, the thickness uniformity of the SiO film formed on the surface of the wafer 200 (hereinafter also referred to as "thickness uniformity at the surface") may be degraded. When the film-forming temperature is equal to or lower than 400° C. or the film-forming pressure is equal to or lower than 665 Pa, the excess gaseous reaction may be properly suppressed and the thickness uniformity of the SiO2 film at the surface of the wafer 200 may be improved. When the film-forming temperature is equal to or lower than 350° C., the excessive gaseous reaction may be more appropriately suppressed and the thickness uniformity of the SiO2 film at the surface of the wafer 200 may be further improved.

By supplying the TEB gas to the wafer 200 under the above-described conditions, the boron-containing layer having a thickness of, for example, less than one atomic layer to several atomic layers (less than one molecular layer to several molecular layers) is formed on the top surface of the wafer 200 as a first layer (initial layer). The boron-containing layer may be a boron layer, an adsorption layer of TEB, or both. The first layer may be a continuous layer or a discontinuous layer. The first layer may include a carbon (C) from TEB.

After the first layer is formed on the wafer 200, the valve 243a is closed to stop the supply of TEB gas. With the APC valve 244 open, the vacuum pump 246 vacuum-exhausts the interior of the process chamber 201 to remove an unreacted TEB gas or the TEB gas that has contributed to formation of the first layer remaining in the process chamber 201. Simultaneously, $N_2$ gas is continuously supplied into the process chamber 201 by opening the valves 243d, 243e and 243f The $N_2$ gas acts as a purge gas.

Second Step

After the first step is complete, BTBAS gas is supplied onto the wafer 200 in the process chamber 38, i.e. onto the first layer formed on the wafer 200 in the process chamber 201.

In the second step, the valves 243b, 243d, 243e and 243f are controlled in the same manner as in the first step. After the flow rate of BTBAS gas is adjusted by the MFC 241b, the BTBAS gas is supplied into the process chamber 201 and onto the wafer 200 through the nozzle 249b and exhausted through the exhaust pipe 231.

Exemplary processing conditions of the second step are as follows:

The flow rate of BTBAS gas: 10 sccm to 1,000 sccm;

The time duration of BTBAS gas supply: 1 second to 120 seconds, preferably 5 second to 60 seconds;

The flow rate of N2 gas: 50 sccm to 10,000 sccm;

The film-forming temperature: 200° C. to 400° C., preferably 300° C. to 350° C.; and The film-forming pressure: 1 Torr to 20 Torr (133 Pa to 2,660 Pa).

By supplying the BTBAS gas to the wafer 200 under the above-described conditions, the silicon-containing layer having a thickness of, for example, less than one atomic layer to several atomic layers (less than one molecular layer to several molecular layers) is formed on the top surface of the wafer 200, i.e. on the first layer formed on the wafer 200 as a second layer. That is, a laminated layer of the first layer and the second layer formed on the first layer is formed on the wafer 200. Hereinafter, the laminated layer of the first layer and the second layer is referred to as the second layer/first layer." The silicon-containing layer may include a silicon layer, an adsorption layer of BTBAS, or both. In order for the second layer to securely act as an oxidation block layer described later, it is preferable that the second layer continuously covers the surface of the first layer, i.e., it is preferable that the second layer protects an entirety of the surface of the first layer. That is, the second layer may include a continuous layer having a thickness of one or more atomic layer (molecular layer). The second layer may include carbon (C) or nitrogen (N) from BTBAS.

After the second layer is formed, the valve 243b is closed to stop the supply of the BTBAS gas into the process chamber 201. An unreacted BTBAS gas or the BTBAS gas that has contributed to formation of the second layer remaining in the process chamber 201 is exhausted from the process chamber 201 in the same manner as in the first step.

Third Step

After the second step is complete, $O_3$ gas is supplied onto the wafer 200 in the process chamber 201, i.e. onto the second layer and the first layer formed on the wafer 200 in the process chamber 201.

In the third step, the valves 243c, 243d, 243e and 243f are controlled in the same manner as in the first step. After the flow rate of $O_3$ gas is adjusted by the MFC 241c, the $O_3$ gas is supplied into the process chamber 201 and onto the wafer 200 through the nozzle 249c and exhausted through the exhaust pipe 231.

Exemplary processing conditions of the third step are as follows:

The flow rate of $O_3$ gas: 1,000 sccm to 10,000 sccm;
The time duration of $O_3$ gas supply: 1 second to 120 seconds, preferably 5 second to 60 seconds;
The flow rate of $N_2$ gas: 50 sccm to 10,000 sccm; The film-forming temperature: 200° C. to 400° C., preferably 300° C. to 350° C.; and
The film-forming pressure: 0.5 Torr to 10 Torr (66.5 Pa to 1,330 Pa).

By supplying the $O_3$ gas to the wafer 200 under the above-described conditions, at least a portion of the second layer/first layer may be modified (oxidized). That is, at least a portion of the oxygen contained in the $O_3$ gas may be added to at least a portion of the second layer/first layer, e.g., to the top surface of the second layer, to form a Si—O bond in the second layer. At least a portion of the second layer/first layer is modified into a third layer including silicon, boron and oxygen, i.e., a boron-doped SiO layer (SiBO layer). During the formation of the third layer, most of the boron contained in the first layer remain unoxidized. This is because the second layer blocks $O_3$ from reaching the first layer. In the third step, the second layer is oxidized instead of the first layer to act as an oxidation barrier layer (oxidation barrier layer), thereby protecting the first layer from oxidation. By protecting the first layer with the second layer, the oxidation of the first layer is suppressed and boron contained in the first layer is prevented from being desorbed from the first layer. As a result, the boron concentration of the SiO film formed on the wafer 200 may be increased.

During the formation of the third layer, nitrogen or carbon contained in the second layer/first layer is desorbed from the second layer/first layer by the modifying reaction by the $O_3$ gas and is discharged from the process chamber 201. The amount of the desorbed components may be appropriately controlled by adjusting the process conditions such as the flow rate or the supply time of the $O_3$ gas supplied in the third step, i.e., by adjusting the degree of oxidizing power of the $O_3$ gas. By adjusting the amount of desorbed nitrogen or carbon, the third layer may be a boron-doped $SiO_2$ layer which does not contain nitrogen or carbon, or a boron-doped $SiO_2$ layer that contains at least one of nitrogen and carbon. According to the result of research conducted by the inventors of the present application, nitrogen is more likely to be desorbed than carbon. For example, when the process conditions of the third step are the same as the above-described process conditions, it is confirmed that the concentration of carbon remaining in the film is 2 atomic %, and the concentration of nitrogen remaining in the film is 1 atomic %.

After the third layer is formed, the valve 243c is closed to stop the supply of the $O_3$ gas into the process chamber 201. An unreacted $O_3$ gas or the $O_3$ gas that has contributed to formation of the third layer remaining in the process chamber 201 is exhausted from the process chamber 201 in the same manner as in the first step.

Performing Predetermined Number of Times

The boron-doped SiO film having a desired composition and a desired thickness may be formed on the wafer 200 by performing a cycle including the first step, the second step and the third step of the film-forming process a predetermined number of times (n times, where n is an integer equal to or greater than 1). The first step, the second step and the third step of the cycle are performed non-simultaneously. It is preferable that the cycle is performed a predetermined number of times. That is, it is preferable that the boron-doped SiO film having a desired thickness is formed by laminating the third layer each of which is thinner than the desired thickness by repeating the cycle a predetermined number of times until the desired thickness obtained. As described above, nitrogen or carbon may remain in the boron-doped SiO film by adjusting the process conditions of the third step. A film such as the boron-doped SiO film including at least one of nitrogen and carbon, e.g. SiBON film, SiBOC film and SiBOCN film, may be formed on the wafer 200.

While the TEB gas is exemplified as the boron-containing gas (first gas), various gases may be used as the boron-containing gas. For example, the boron-containing gas may include an alkylborane-based gas such as methylborane $(CH_3BH_2)$ gas, ethylborane $(C_2H_5BH_2)$ gas, butylborane $(C_4H_9BH_2)$ gas, dimethylborane $((CH_3)_2BH)$ gas, diethylborane $((C_2H_5)_2BH)$ gas, triethylborane $((C_2H_5)_3B)$ gas, tripropylborane $((C_3H_7)_3B)$ gas, triisopropylborane $([(CH_3)_2CH]_3B)$ gas, tributylborane $((C_4H_9)_3B)$ gas and triisobutylborane $([(CH_3)_2CHCH_2]_3B)$ gas. Preferably, the boron-containing gas may include gases having a molecular structure that does not satisfy the octet rule. The octet rule refers to an empirical rule that the reactivity of a compound or an ion is stabilized when the number of electrons in the outermost shell of the atom is eight, i.e., when the compound or the ion has a closed shell structure. The gases that do not satisfy the octet rule such as TEB gas is unstable and has high reactivity toward satisfying the octet rule. Therefore, the gases which do not satisfy the octet rule is likely to be strongly adsorbed to the surface of the wafer 200 when supplied into the process chamber 201. By using a gas that does not satisfy the octet rule as the boron-containing gas, the formation of the first layer may be promoted to increase the boron concentration of the SiO film.

While the BTBAS gas is exemplified as the silicon-containing gas (the second gas), various gases may be used as the silicon-containing gas. For example, an aminosilane-based gas such as tetrakis dimethylaminosilane $(Si[N(CH_3)_2]_4$, abbreviated as 4DMAS) gas, trisdimethylaminosilane $(Si[N(CH_3)_2]_3H$, abbreviated as 3DMAS) gas, bisdiethylaminosilane $(Si[N(C_2H_5)_2]_2H_2$, abbreviated as BDEAS) gas and diisopropylaminosilane $(SiH_3N[CH(CH_3)_2]_2$, abbreviated as DIPAS) gas may be used as the silicon-containing gas (the second gas). A silicon hydride gas containing Si—H bonds such as monosilane $(SiH_4$, abbreviated as MS) gas, disilane $(Si_2H_6$, abbreviated as DS) gas and trisilane $(Si_3H_8$, abbreviated as TS) gas may also be used as the silicon-containing gas. A siloxane-based gas such as hexamethyldisiloxane $([(CH_3)_3Si]_2O$, abbreviated as HMDSO) gas, tetramethyldisiloxane $([H(CH_3)_2Si]_2O)$ gas, hexachlorodisiloxane $((Cl_3Si)_2O)$ gas and tetrachlorodisiloxane $([HCl_2Si]$ $_2$O) gas may also be used as the silicon-containing gas. A chlorosilane-based gas such as monochlorosilane (SiH$_3$C$_1$, abbreviated as MCS) gas, dichlorosilane (SiH$_2$C$_{12}$, abbreviated as DCS) gas, trichlorosilane (SiHCl$_3$, abbreviated as TCS) gas, tetrachlorosilane (SiCl$_4$, abbreviated as STC) gas, hexachlorodisilane (Si$_2$Cl$_6$, abbreviated as HCDS) gas and octachlorotrisilane (Si$_3$Cl$_8$, abbreviated as OCTS) gas may also be used as the silicon-containing gas.

While the O$_3$ gas is exemplified as the oxygen-containing gas (third gas), various gases may be used as the oxygen-containing gas. For example, a gas such as water vapor (H$_2$O gas), nitrogen monoxide (NO) gas, nitrous oxide (N$_2$O) gas, nitrogen dioxide (NO$_2$) gas, carbon monoxide (CO) gas, carbon dioxide (CO$_2$) gas, oxygen (O$_2$) gas, plasma-excited O$_2$ gas (O$_2$*), a mixture of hydrogen (H$_2$) gas and oxygen (O$_2$) gas, and a mixture of H$_2$ gas and O$_3$ gas may be used as the oxygen-containing gas. The O$_3$ gas, the plasma-excited O$_2$ gas (O$_2$*) and the mixture of H$_2$ gas and O$_2$ gas have very strong oxidizing power. Even when the O$_3$ gas, the plasma-excited O$_2$ gas and the mixture of hydrogen gas and O$_2$ gas are used as the oxygen-containing gas, the first layer can be protected with the second layer acting as an oxidation block layer by performing the second step before the third step. As a result, the desorption of boron from the first layer is suppressed.

While the N$_2$ gas is exemplified as the inert gas, rare gases such as argon (Ar) gas, helium (He) gas, neon (Ne) gas and xenon (Xe) gas may be used as the inert gas.

Purging and Returning to Atmospheric Pressure Step

After the film having a desired composition and a desired thickness is formed on the wafer 200, the N$_2$ gas serving as a purge gas is supplied into the process chamber 201 through the gas supply pipes 232d, 232e and 232f and then exhausted through the exhaust pipe 231. The process chamber 201 is thereby purged such that the gas or the reaction by-products remaining in the process chamber 201 are removed from the process chamber 201 (purging). Thereafter, the inner atmosphere of the process chamber 201 is replaced with the inert gas (substitution by inert gas), and the inner pressure of the process chamber 38 is returned to atmospheric pressure (returning to atmospheric pressure).

Boat Unloading and Wafer Discharging Step

Then, the seal cap 219 is lowered by the boat elevator 115 and the lower end of the manifold 209 is opened. The boat 217 with the processed wafers 200 charged therein is unloaded from the reaction tube 203 through the lower end of the manifold 209 (boat unloading). After the boat 217 is unloaded, the shutter 219s closes the lower end opening of the manifold 209 to seal the lower end opening via the O-ring 220c (shutter closing). The processed wafers 200 are then discharged from the boat 217 (wafer discharging).

Effects of the Embodiment

One or more advantageous effects described below are provided according to the embodiment.

(a) By performing the second step before performing the third step, the second layer formed in the second step may serve as the oxidation block layer to prevent the first layer from coming in contact with O$_3$ gas. Accordingly, the desorption of boron from the first layer is suppressed such that the boron concentration of the SiO film formed on the wafer 200 is increased. The SiO film formed according to the embodiment ha high boron concentration. Therefore, the SiO film may be used as a doping film for forming a channel by thermally diffusing boron contained in the SiO film into an underlying layer. In the case of fabricating a semiconductor device having a 3D structure such as a FinFET, it is difficult to uniformly and accurately dope boron to form the channel by conventional ion implantation method. However, the above problem may be solved by using the boron-doped SiO film in accordance with the embodiment as the doping film.

(b) By performing the third step after performing the first step and the second step, oxygen is prevented from diffusing into the surface of the wafer 200, which is very advantageous when fabricating a semiconductor device having 3D structure.

(c) By forming the second layer to continuously cover the entire surface of the first layer, the second layer more reliably acts as the oxidation block layer for the entire surface of the wafer 200. Therefore, the SiO2 film formed on the wafer 200 may have a high boron concentration over the entire surface of the wafer 200. Moreover, the entire surface of the first layer on the wafer 200 is reliably prevented from being oxidized.

(d) By using TEB gas free of chlorine as the boron-containing gas instead of a gas containing boron and chlorine such as trichloroborane (BCl$_3$) gas, the film-forming rate of the SiO film formed on the wafer 200 may be improved. When BCl$_3$ gas is used as the boron-containing gas, the chlorine contained in BCl$_3$ gas obstructs the adsorption of BTBAS onto the wafer 200 due to the attack of chlorine on silicon, resulting in a decrease in the film-forming rate. Moreover, When BCl$_3$ gas is used as the boron-containing gas, the SiO film is etched by BCl$_3$ gas during the film-forming process, resulting in a degradation of the film-forming rate. The above problems may be solved by using TEB gas free of chlorine as the boron-containing gas.

(e) By using TEB gas free of chlorine as the boron-containing gas, the penetration of chlorine into the SiO$_2$ film on the wafer 200 may be suppressed. As a result, high quality SiO film having superior ashing resistance or etching resistance may be obtained.

(f) The SiO film formed on the wafer 200 may be doped with carbon by using a gas containing carbon such as TEB gas as the boron-containing gas. The SiO2 film may be doped with nitrogen or carbon by using a gas containing nitrogen and carbon such as BTBAS gas as the silicon-containing gas. As a result, high quality SiO film may be having superior etching resistance may be obtained.

(g) Since the SiO film is formed by non-simultaneously performing the first step through the third step rather than simultaneously performing the first step through the third step, the characteristics of the SiO film such as step coverage, film thickness controllability and film thickness uniformity at the surface may be improved. This film forming technique is particularly effective when underlying structure is a 3D structure such as line and space structure, hole structure and pin structure.

(h) The above-described effects may also be obtained when different gases are used as the boron-containing gas, the silicon-containing gas, the oxygen-containing gas and the inert gas instead of TEB gas and BTBAS gas, O$_3$ gas and N$_2$ gas, respectively.

(4) Modified Examples

The film-forming process according to the embodiment may be modified as in the modified examples described below.

First Modified Example

Figure 4B:
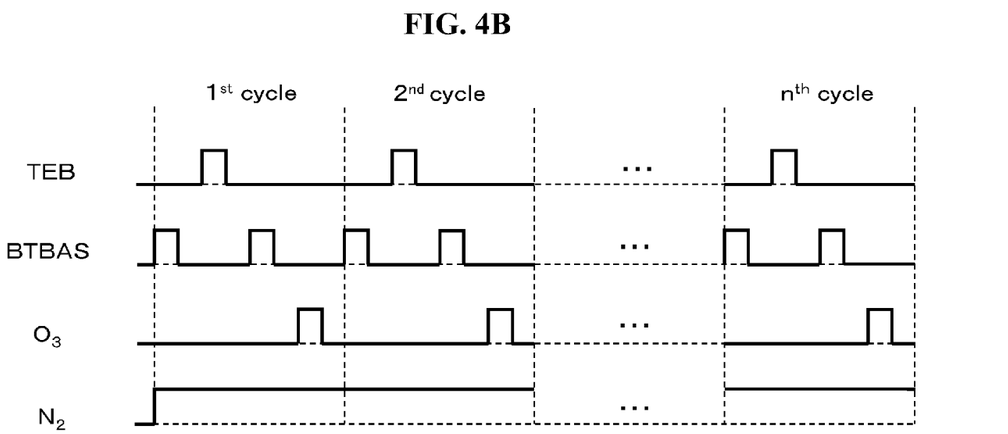

As shown in FIG. 4B and the film-forming sequence shown below, the cycle may further include a fourth step of supplying BTBAS gas (fourth gas) to the wafer 200 before performing the first step. The processing sequences and process conditions of the fourth step may be the same as those of the second step of the film-forming sequence shown in FIG. 4A. By performing the fourth step, a fourth layer, which is a silicon-containing layer, is formed on the wafer 200. Similar to the silicon-containing layer formed in the second step, the silicon-containing layer formed in the fourth step may be a silicon layer, a BTBAS adsorption layer, or both. The boron-containing layer (first layer) formed in the first step is disposed between the lower silicon-containing layer (fourth layer) formed in the fourth step and the upper silicon-containing layer formed in the second step. By performing the cycle of non-simultaneously and sequentially performing the fourth step and the first step through the third step a predetermined number of times, a boron-doped SiO2 film is formed on the wafer 200.

(BTBAS→TEB→BTBAS→O₃)×n→boron-doped SiO

According to the first modified example, the same advantageous effects as those of the film-forming sequence shown in FIG. 4A are obtained. Since the silicon-containing layers are disposed on and under the boron-containing layer according to the first modified example, boron is more reliably prevented from desorbing from the boron-containing layer. This is because the boron contained in the boron-containing layer of the first modified example bonds with the silicon contained in both of the silicon-containing layers disposed on and under the boron-containing layer. Moreover, since the silicon-containing layers disposed under the boron-containing layer prevents the diffusion of boron into underlying layers, the boron in the SiO film formed according to the first modified example is less likely to diffuse into underlying layers compared to the boron in the SiO film formed according to the film-forming sequence shown in FIG. 4A.

Second Modified Example

Figure 5A:
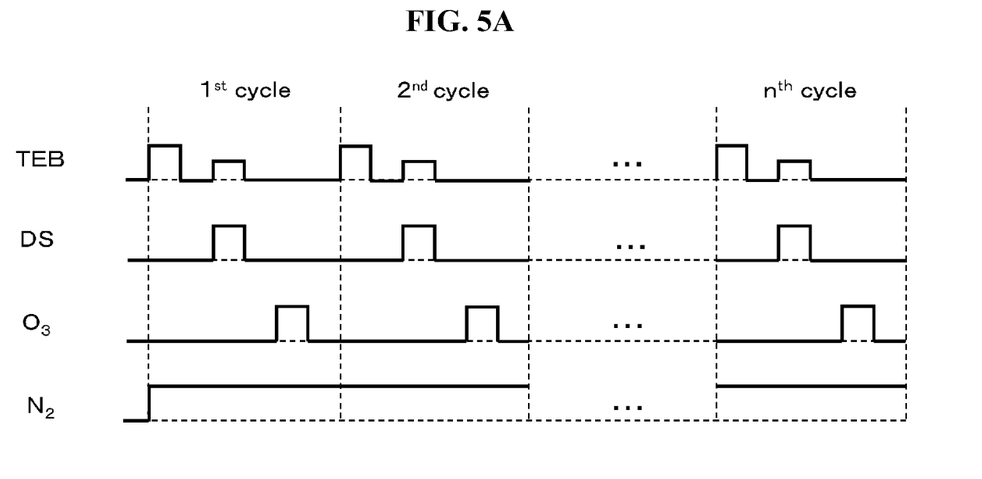
FIGS. 5A, 5B, and 5C schematically illustrate a second modified example, a third modified example and a fourth modified example of the film-forming sequence according to the embodiment, respectively.

DS gas, which has a relatively high thermal decomposition temperature compared to aminosilanes such as BTBAS, may be used as the silicon-containing gas in the film-forming sequence shown below or shown in FIG. 5A. DS gas may be supplied along with TEB gas.

(TEB→DS+TEB→O₃)×n→boron-doped SiO

According to the second modified example, the same advantageous effects as those of the film-forming sequence shown in FIG. 4A are provided. When TEB gas is supplied along with DS gas, TEB gas may act as a pseudo-catalyst to accelerate the decomposition of DS gas, i.e., silicon hydride including Si—H bonds. The pseudo-catalyst facilitates practical film-forming rates of the SiO₂ film even at a relatively low temperature, for example, equal to or lower than 400° C. at which DS gas is not likely to be thermally decomposed when only DS gas is present in the process chamber 201. Thus, unlike the TEB gas supplied in the first step, TEB gas supplied along with DS gas in the second step may act as a catalytic material rather than as a boron source. Herein, the term "catalyst" refers to a substance which does not change itself before or after a chemical reaction but which changes the rate of the reaction. In a second modified example, while the pseudo-catalyst changes properties such as the rate of the reaction, the pseudo-catalyst is not a catalyst since at least some of the pseudo-catalyst changes before and after the chemical reaction. Herein, a substance that behaves similar to a catalyst, but at least a part of itself changes before and after a chemical reaction is referred to as "pseudo-catalyst."

Preferably, the flow rate (partial pressure) of TEB gas supplied in the second step is lower than that of TEB gas supplied in the first step such that TEB gas can act more effectively and suitably as a pseudo-catalyst to prevent the degradation of the uniformity of the SiO film at the surface. In addition, TEB gas consumption, i.e., cost of using TEB gas may be reduced. In the second step, since TEB gas is used as a pseudo-catalyst rather than a boron source, the time duration of supplying TEB gas in the second step may be shorter than that of supplying DS gas in the second step. That is, when TEB gas is supplied along with DS gas in the second step, the time duration of supplying TEB gas may be shorter than that of supplying DS gas to reduce the TEB gas consumption, i.e., the cost of using TEB gas. Except for the time duration of supplying TEB gas, Other processing sequences and process conditions are same as those of the film-forming sequence shown in FIG. 4A.

Third Modified Example

Figure 5B:
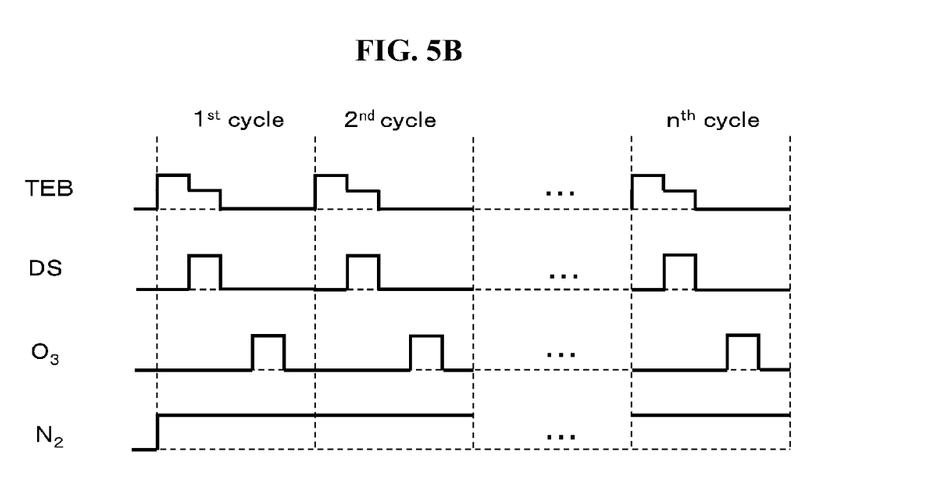

As shown in FIG. 5B, after the first layer is formed in the first step of the second modified example, the purging of the inside of the process chamber 201 may not be performed. That is, the first step of supplying TEB gas into the process chamber 201 and the second step of supplying TEB gas into the process chamber 201 may be continuously performed without performing a purge process therebetween. Other processing sequences and process conditions are the same as those of the film-forming sequence or the second modified example shown in FIG. 4A.

According to the third modified example, the same advantageous effects as those of the film-forming sequence shown in FIG. 4A are provided. When a purge process is not performed after forming the first layer in the first step, TEB gas remaining in the process chamber 201 may be mixed with DS gas and act as a pseudo-catalyst for DS gas. Therefore, the third modified example provides the same advantageous effects as the second modified example. By using TEB gas remaining in the process chamber 201 after forming the first layer in the first step, TEB gas may be efficiently used and the cost of using TEB gas may be further reduced. By not performing the purge process after forming the first layer in the first step, the time required for performing one cycle is shortened, thereby improving the productivity of the film-forming process.

Fourth Modified Example

Figure 5C:
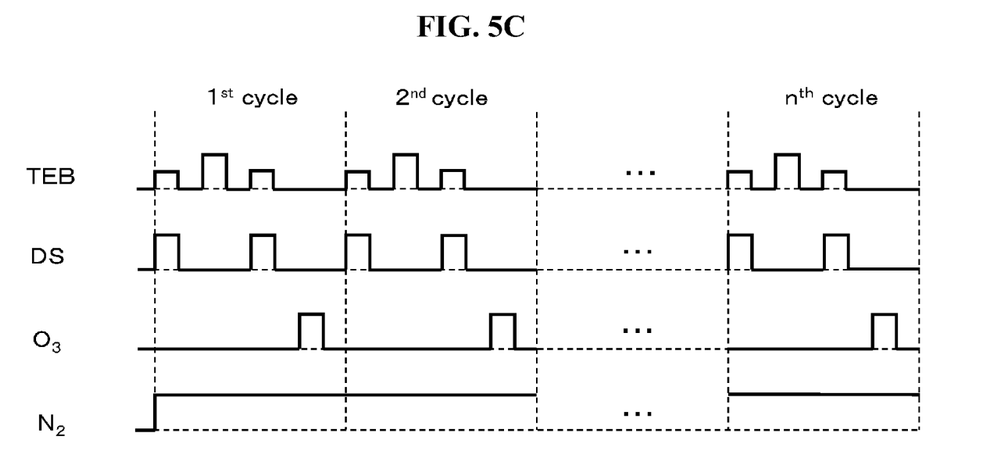

As shown in FIG. 5C, the first modified example and the second modified example may be combined. That is, the fourth step may be performed similar to the first modified example, DS gas may be used as the silicon-containing gas in each of the fourth step and the second step similar to the second modified example, and TEB gas may be supplied along with DS gas in each of the fourth step and the second step.

(DS+TEB→TEB→DS+TEB→O₃)×n→boron-doped SiO

According to the fourth modified example, the same advantageous effects as those of the film-forming sequence shown in FIG. 4A, the first modified example and the second modified example are provided. Similar to the second modified example, it is preferable that the flow rate (partial pressure) of TEB gas supplied in the fourth step and the second step is lower than that of TEB gas supplied in the first step and the time duration of supplying TEB gas in the fourth step and the second step is shorter than that of supplying DS gas in the fourth step and the second step. Other processing sequences and process conditions are same as those of the film-forming sequence shown in FIG. 4A. The fourth modified example and the third modified example may be further combined. For example, in the fourth modified example, it is not necessary to perform the purge process of the process chamber 201 after performing the fourth step and the first step. When the purge process is not performed, the fourth modified example provides the same advantageous effects as those of the third modified example.

Fifth Modified Example

In the film-forming sequences described below, a phosphorus-containing gas such as a PH gas may be used as the dopant gas. The processing sequences and the process conditions when supplying PH gas may be the same as the processing sequences and the process conditions when supplying TEB gas. According to the fifth modified example, the same advantageous effects as those of the film-forming sequence or the first modified example shown in FIG. 4A are provided.

(PH→BTBAS→$O_3$)×$n$→phosphorus-doped SiO (BTBAS→PH→BTBAS→$O_3$)×$n$→phosphorus-doped SiO Other Embodiments While the technique is described by way of the above-described embodiment, the above-described technique is not limited thereto. The above-described technique may be modified in various ways without departing from the gist thereof.

While the embodiment is exemplified by forming a film containing silicon as a main element on a substrate, the above-described technique is not limited thereto. For example, the above-described technique may be applied to the formations of metal oxide films such as a boron-doped hafnium oxide film (boron-doped HfO film), a boron-doped zirconium oxide film (boron-doped ZrO film) and a boron-doped titanium oxide film (boron-doped TiO film) by the film-forming sequences described below using the second gas and the fourth gas. Each of the second gas and the fourth gas may include a gas containing an amino group (amino ligand), e.g. a hafnium-containing gas such as tetrakis ethylmethylamino hafnium (Hf[N($C_2H_5$)($CH_3$)]$_4$, abbreviated as TEMAH) gas, a zirconium-containing gas such as tetrakis ethylmethylamino zirconium (Zr[N($C_2H_5$)($CH_3$)]$_4$, abbreviated as TEMAZ) gas and a titanium-containing gas such as tetrakis dimethylamino titanium (Ti[N($CH_3$)$_2$]$_4$, abbreviated as TDMAT). That is, the above-described technique may be preferably applied to the formation of the film containing a metal element as a main element.

(TEB→TEMAH→$O_3$)×$n$→boron-doped HfO (TEMAH→TEB→TEMAH→$O_3$)×$n$→boron-doped HfO (TEB→TEMAZ→$O_3$)×$n$→boron-doped ZrO (TEMAZ→TEB→TEMAZ→$O_3$)×$n$→boron-doped ZrO (TEB→TDMAT→$O_3$)×$n$→boron-doped TiO (TDMAT→TEB→TDMAT→$O_3$)×$n$→boron-doped TiO For example, the above-described technique may be applied to the formations of metal silicate films such as a boron-doped hafnium silicate film (boron-doped HfSiO film), a boron-doped zirconium silicate film (boron-doped ZrSiO film), or a boron-doped titanium silicate film (boron-doped TiSiO film) by the film-forming sequences described below using the second gas and the fourth gas. Each of the second gas and the fourth gas may include a gas containing metal element such as TEMAH gas, TEMAZ gas and TDMAT gas and a silicon-containing gas such as BDEAS. The following film-forming sequences are mere examples and the order of supplying the gas containing metal element and the silicon-containing gas may be interchanged.

(TEB→TEMAH→BDEAS→$O_3$)×$n$→boron-doped HfSiO (TEMAH→TEB→BDEAS→$O_3$)×$n$→boron-doped HfSiO (TEB→TEMAZ→BDEAS→$O_3$)×$n$→boron-doped ZrSiO (TEMAZ→TEB→BDEAS→$O_3$)×$n$→boron-doped ZrSiO (TEB→TDMAT→BDEAS→$O_3$)×$n$→boron-doped TiSiO (TDMAT→TEB→BDEAS→$O_3$)×$n$→boron-doped TiSiO The recipe used for substrate processing is preferably prepared individually according to the processing contents and is stored in the memory device 121c via an electric communication line or the external memory device 123. When starting the substrate processing, the CPU 121a preferably selects an appropriate recipe among the plurality of recipe stored in the memory device 121c according to the contents of the substrate processing. Thus, various films having different composition ratios, different qualities and different thicknesses may be formed at high reproducibility using a single substrate processing apparatus. Further, since the burden on the operator may be reduced, various processes may be performed quickly while avoiding a malfunction of the apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the telecommunication line or the recording medium in which the new recipe is stored. The existing recipe already stored in the substrate processing apparatus may be directly changed to a new recipe by operating the I/O device 122 of the substrate processing apparatus.

While a batch type substrate processing apparatus capable of simultaneously processing plurality of substrates to form the film is exemplified in the above-described embodiment, the above-described technique is not limited thereto. For example, the above-described technique may be applied to the film formation using a single type substrate processing apparatus capable of processing a substrate. While a substrate processing apparatus having hot wall type processing furnace is exemplified in the above-described embodiment, the above-described technique is not limited thereto. For example, the above-described technique may be applied the film formation using a substrate processing apparatus having cold wall type processing furnace.

The film formation may be performed according to the processing sequences and the processing conditions same as those of the above-described embodiments and modified examples using these substrate processing apparatuses, and the same effects may be obtained.

The above-described embodiments and the modified examples may be appropriately combined. The processing sequences and the processing conditions of the combinations may be substantially the same as those of the above-described embodiment.

Result of Experiment

The results of experiments supporting the effects of the above-described embodiments will be described below.

In the experiment, a SiO film was formed on the wafer using the substrate processing apparatus shown in FIG. 1 and the film-forming sequence shown in FIG. 4b. The fourth step, the first step, the second step and the third step are performed sequentially and non-simultaneously according to the film-forming sequence shown in FIG. 4b. The processing sequences and the processing conditions of the fourth step, the first step, the second step and the third step were the same those of the embodiment described above.

As the comparative example, a SiO film was formed on the wafer by performing a cycle a predetermined number of times using the substrate processing apparatus shown in FIG. 1. The cycle includes sequentially and non-simultaneously performing a second comparative step of supplying BTBAS gas to the wafer, a first comparative step of supplying TEB gas to the wafer and a third comparative step of supplying $O_3$ gas to the wafer. The processing conditions for the second comparative step, the first comparative step and the third comparative step are same as those of the second step, the first step and the third step of the above-described embodiment, respectively.

Figure 6:
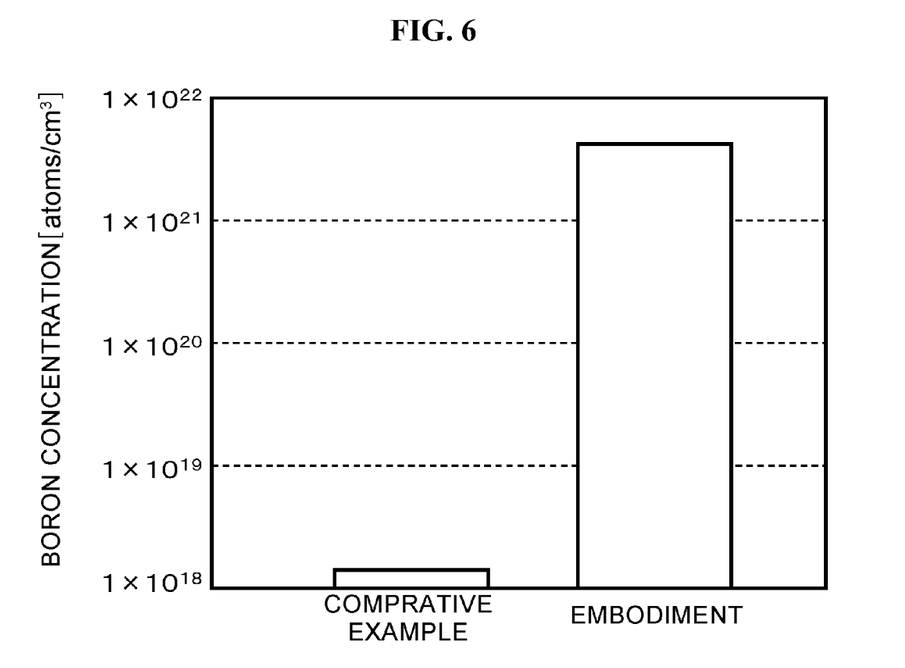
FIG. 6 illustrates boron concentrations of SiO films formed on wafer.

The boron concentrations of the SiO films formed according to the embodiment and the comparative example were respectively measured. FIG. 6 shows the boron concentrations of the SiO films formed according to the embodiment and the comparative example. The comparative example and the embodiment are shown in FIG. 6 from the left to the right along the horizontal axis, and the vertical axis shown in FIG. 6 represents the boron concentrations [atoms/cm$^3$] of the SiO film formed according to the comparative example and the embodiment. Referring to FIG. 6, the boron concentration of the SiO film formed according to the embodiment is in the order of $1 \times 10^{21}$ [atoms/cm$^3$], which confirms that a sufficient amount of boron remains in the film. That is, according to the embodiment, by sequentially performing the fourth step, the first step through the third step, the boron-containing layer formed in the first step is protected and the desorption of boron from the boron-containing layer is suppressed. Contrarily, the boron concentration of the SiO film formed according to the comparative example is in the order of $1 \times 10^{18}$ [atoms/cm$^3$], which confirms that the amount of boron in the SiO film is very small as compared to that of boron in the SiO film formed according to the embodiment. The reason for low boron concentration is that that $O_3$ gas is supplied to the boron-containing layer formed on the wafer in the first comparative step by sequentially performing the second comparative step, the first comparative step and the third comparative step, resulting in a large desorption of boron from the boron-containing layer. It is confirmed by the inventors of the present invention that a SiO film having high boron concentration compared with the comparative example is formed even when only the first step through the third step are performed without performing the fourth step according to the film-forming sequence shown in FIG. 4A.

PREFERRED EMBODIMENTS OF THE ABOVE-DESCRIBED TECHNIQUE

Hereinafter, preferred embodiments according to the above-described technique are supplementarily noted.

Supplementary Note 1

According to an aspect of the above-described technique, there is provided a method of manufacturing a semiconductor device or a method of processing a substrate including: forming on a substrate an oxide film containing silicon or a metal element and doped with a dopant by performing a cycle a predetermined number of times, wherein the cycle includes sequentially and non-simultaneously performing: (a) supplying a first gas to the substrate wherein the first gas is free of chlorine and contains boron or phosphorus as the dopant; (b) supplying a second gas to the substrate wherein the second gas contains silicon or the metal element; and (c) supplying a third gas to the substrate wherein the third gas contains oxygen.

Supplementary Note 2

In the method of Supplementary note 1, preferably, a first layer containing the dopant may be formed on the substrate in (a), and a second layer containing silicon or the metal element may be formed on the first layer in (b).

Supplementary Note 3

In the method Supplementary note 2, preferably, a surface of the first layer may be covered by the second layer in (b).

Supplementary Note 4

In the method of any one of Supplementary notes 2 and 3, preferably, an oxidation of the first layer is suppressed by the second layer in (c).

Supplementary Note 5

In the method of any one of Supplementary notes 1 through 4, preferably, the cycle may further includes performing: (d) supplying the second gas to the substrate before performing (a). Preferably, a fourth layer containing silicon or the metal element may be formed on the substrate in (d).

Supplementary Note 6

In the method of any one of Supplementary notes 1 through 5, preferably, the first gas may be further supplied along with the second gas in (b). Preferably, the first gas supplied along with the second gas in (b) may act as a pseudo-catalyst. Preferably, a flow rate of the first gas supplied in (b) may be lower than that of the first gas supplied in (a).

Supplementary Note 7

In the method of Supplementary note 5, preferably, the first gas may be further supplied along with the second gas in (d). Preferably, the first gas supplied along with the second gas in (d) may act as a pseudo-catalyst. Preferably, a flow rate of the first gas supplied in (d) may be lower than that of the first gas supplied in (a).

Supplementary Note 8

In the method of any one of Supplementary notes 1 through 7, preferably, the second gas may include Si—H bond. Preferably, the second gas may include silicon hydride. Preferably, the second gas may include disilane gas.

Supplementary Note 9

In the method of any one of Supplementary notes 1 through 7, preferably, the second gas may include amino group. Preferably, the second gas may include aminosilane gas.

Supplementary Note 10

In the method of any one of Supplementary notes 1 through 9, preferably, the first gas may include alkyl group. Preferably, the first gas may include ethyl group. Preferably, the first gas may include gas that does not satisfy the octet rule. Preferably, the first gas may include triethylborane gas.

Supplementary Note 11

In the method of any one of Supplementary notes 1 through 10, preferably, the third gas may be free of nitrogen. Preferably, the third gas may include at least one gas selected from the group consisting of ozone gas, plasma-excited oxygen gas, oxygen gas and hydrogen gas.

Supplementary Note 12

In the method of any one of Supplementary notes 1 through 11, preferably, a temperature of the substrate may range from 200° C. to 400° C. in forming the oxide film.

Supplementary Note 13

According to another aspect of the above-described technique, there is provided a substrate processing apparatus including: a process chamber where a substrate is processed; a first supply system configured to supply a first gas to the substrate in the process chamber wherein the first gas is free of chlorine and contains boron or phosphorus as a dopant; a second supply system configured to supply a second gas to the substrate in the process chamber wherein the second gas contains silicon or the metal element; a third supply system configured to supply a third gas to the substrate in the process chamber wherein the third gas contains oxygen; and a controller configured to control the first supply system, the second supply system and the third supply system to form on the substrate an oxide film containing silicon or a metal element and doped with a dopant by performing a cycle a predetermined number of times, wherein the cycle includes sequentially and non-simultaneously performing: (a) supplying the first gas to the substrate in the process chamber; (b) supplying the second gas to the substrate in the process chamber; and (c) supplying the third gas to the substrate in the process chamber.

Supplementary Note 14

According to still another aspect of the above-described technique, there is provided a program or a non-transitory computer-readable recording medium storing a program that causes, by a computer, a substrate processing apparatus to perform: forming, on a substrate in a process chamber of the substrate processing apparatus, an oxide film containing silicon or a metal element and doped with a dopant by performing a cycle a predetermined number of times, wherein the cycle includes sequentially and non-simultaneously performing: (a) supplying a first gas to the substrate wherein the first gas is free of chlorine and contains boron or phosphorus as the dopant; (b) supplying a second gas to the substrate wherein the second gas contains silicon or the metal element; and (c) supplying a third gas to the substrate wherein the third gas contains oxygen.

According to the technique described herein, a dopant concentration of the oxide film formed on a substrate may be increased.

What is claimed is:

1. A method of manufacturing a semiconductor device, comprising:
   forming on a substrate an oxide film containing silicon or a metal element and doped with a dopant by performing a cycle a predetermined number of times, wherein the cycle comprises sequentially and non-simultaneously performing:
   (a) supplying a first gas to the substrate wherein the first gas is free of chlorine and contains boron or phosphorus as the dopant;
   (b) supplying a second gas to the substrate wherein the second gas contains silicon or the metal element; and
   (c) supplying a third gas to the substrate wherein the third gas contains oxygen,
   wherein a first layer containing the dopant is formed on the substrate in (a), and a second layer containing silicon or the metal element is formed on the first layer in (b).

2. The method of claim 1, wherein a surface of the first layer is covered by the second layer in (b).

3. The method of claim 1, wherein a third layer is formed by oxidizing at least a portion of a laminated layer in which the second layer is formed on the first layer in (c).

4. The method of claim 1, wherein an oxidation of the first layer is suppressed by the second layer in (c).

5. The method of claim 1, wherein the first gas is further supplied along with the second gas in (b).

6. The method of claim 5, wherein a flow rate of the first gas supplied in (b) is lower than that of the first gas supplied in (a).

7. The method of claim 1, wherein the second gas comprises Si—H bond.

8. The method of claim 1, wherein the second gas comprises amino group.

9. The method of claim 1, wherein the first gas comprises alkyl group.

10. The method of claim 1, wherein the third gas is free of nitrogen.

11. The method of claim 1, wherein a temperature of the substrate ranges from 200° C. to 400° C. in forming the oxide film.

12. A method of manufacturing a semiconductor device, comprising:
    forming on a substrate an oxide film containing silicon or a metal element and doped with a dopant by performing a cycle a predetermined number of times, wherein the cycle comprises sequentially and non-simultaneously performing:
    (a) supplying a first gas to the substrate wherein the first gas is free of chlorine and contains boron or phosphorus as the dopant;
    (b) supplying a second gas to the substrate wherein the second gas contains silicon or the metal element;
    (c) supplying a third gas to the substrate wherein the third gas contains oxygen; and
    (d) supplying the second gas to the substrate before performing (a).

13. The method of claim 12, wherein a fourth layer containing silicon or the metal element is formed on the substrate in (d), a first layer containing the dopant is formed on the fourth layer in (a), a second layer containing silicon or the metal element is formed on the first layer in (b), and a third layer is formed by oxidizing at least a portion of a laminated layer in which the second layer is formed on the first layer in (c).

14. The method of claim 12, wherein the first gas is further supplied along with the second gas in (d).

15. The method of claim 14, wherein a flow rate of the first gas supplied in (d) is lower than that of the first gas supplied in (a).

* * * * *